United States Patent [19]

Kinugasa et al.

[11] Patent Number: 5,107,137
[45] Date of Patent: Apr. 21, 1992

[54] MASTER-SLAVE CLOCKED CMOS FLIP-FLOP WITH HYSTERESIS

[75] Inventors: Masanori Kinugasa, Yokohama; Munenobu Kida, Tokyo; Toshimasa Ishikawa, Kawasaki, all of Japan

[73] Assignee: Kabushiki Kaisha Toshiba, Kawasaki, Japan

[21] Appl. No.: 576,940

[22] Filed: Sep. 4, 1990

[30] Foreign Application Priority Data

Sep. 5, 1989 [JP] Japan .................. 1-230109

[51] Int. Cl.⁵ .................. H03K 5/13; H03K 19/00
[52] U.S. Cl. .................. 307/272.2; 307/279; 307/481; 307/290
[58] Field of Search .......... 307/279, 481, 451, 272.1, 307/272.2, 576, 290

[56] References Cited

U.S. PATENT DOCUMENTS

| 4,495,628 | 1/1985 | Zasio ........................ 307/272.2 |
| 4,495,629 | 1/1985 | Zasio et al. ................. 307/272.2 |
| 4,554,467 | 11/1985 | Vaughn ..................... 307/269 |
| 4,820,939 | 4/1989 | Sowell et al. ............... 307/269 |
| 4,843,254 | 6/1989 | Motegi et al. ............... 307/481 |
| 5,015,875 | 5/1991 | Giles et al. ................. 307/272.2 |

Primary Examiner—Edward P. Westin
Assistant Examiner—Richard Roseen
Attorney, Agent, or Firm—Finnegan, Henderson, Farabow, Garrett, and Dunner

[57] ABSTRACT

In a master-slave type flip-flop circuit comprising a master output holding circuit of the master stage circuit, the threshold value of the input circuit of the slave stage circuit has a hysteresis characteristic in which the high level threshold value is set to a higher value than the threshold value of the master output holding circuit and the low level threshold value is set to a lower value than the threshold value of the master output holding circuit. Due to the feature, a phenomenon is prevented in which the output is once inverted and then again inverted in the metastable state.

13 Claims, 5 Drawing Sheets

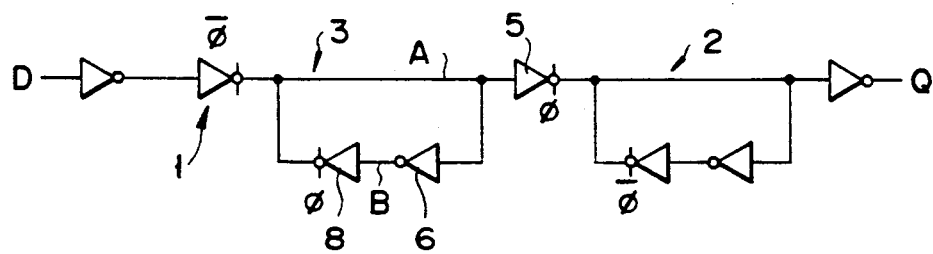
FIG. 4A (PRIOR ART)
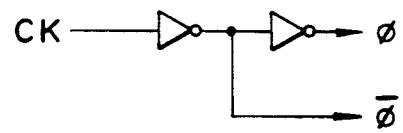
FIG. 4B (PRIOR ART)
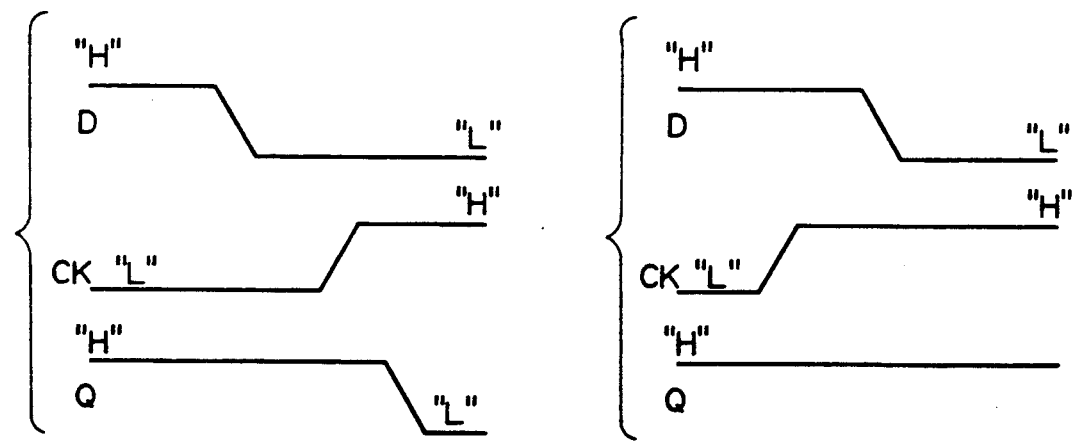
FIG. 5
(PRIOR ART)
FIG. 6
(PRIOR ART)

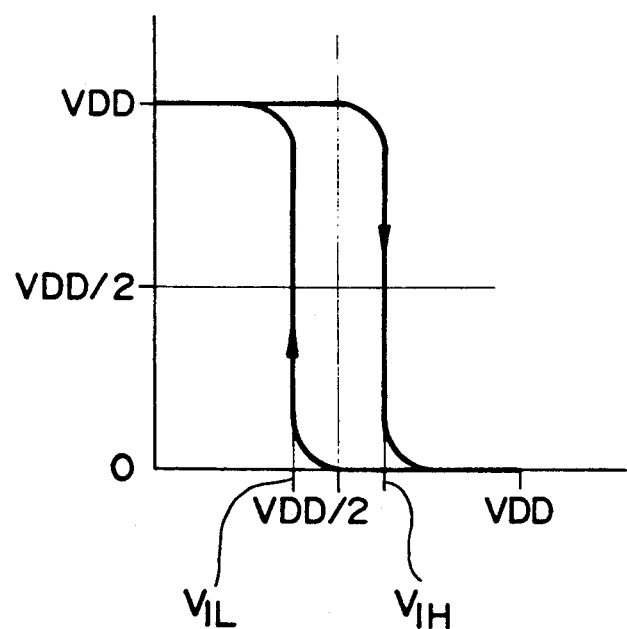
F I G. 16

MASTER-SLAVE CLOCKED CMOS FLIP-FLOP WITH HYSTERESIS

BACKGROUND OF THE INVENTION

1. Field of the Invention

The present invention relates to a master-slave flip-flop circuit and, more particularly, to a flip-flop circuit used in a sequential logic circuit such as a shift register or a counter.

2. Description of the Related Art

Heretofore, when the level of an input signal is inverted in a flip-flop circuit or a sequential logic circuit containing a flip-flop circuit, the level of the output signal is once inverted and again inverted to its original state. This phenomenon is sometimes called a hazard of the output signal. It causes an erroneous operation in an applied circuit in which the output signal is input to a circuit in the applied circuit as a clock signal. In a conventional master-slave flip-flop circuit shown in FIG. 1 the hazard occurs by an anticoincidence of the circuit threshold value $V_{thCH}$ of a holding circuit 3 for holding the output signal of a master stage circuit 1 with the threshold value circuit $V_{thCS}$ of the input circuit of a slave stage circuit 2. Heretofore, in order to make $V_{thCH}$ coincide with $V_{thCS}$ as much as possible, the size of the transistors (not shown) of the clocked inverter of the holding circuit 3 is equalized to the size of the transistors of the clocked inverter 5 of the slave stage circuit 2 (FIG. 2). Alternatively, the circuit threshold value of the inverter 6 of the holding circuit 3 is matched to that of the clocked inverter 5 of the input circuit of the slave stage circuit 2 (FIG. 3).

A process through which the above-mentioned output hazard is generated in the master-slave flip-flop circuit of prior art when the circuit threshold value of the master output holding circuit is unbalanced from that of the input circuit of the stave stage circuit will be described. FIG. 4A shows the same master-slave flip-flop circuit as that in FIG. 3, and FIG. 4B shows a clock signal generator for generating a clock signal to be input to the circuit in FIG. 4A. (i) In the flip-flop circuit shown in FIG. 4A, assume that the circuit threshold value $V_{thCS}$ of the clocked inverter 5 of the slave stage circuit 2 is higher than the circuit threshold value $V_{thCH}$ of the inverter 6 of the holding circuit 3. When the data input D of a flip-flop circuit is changed from a high level (hereinafter referred to as "H") to a low level (hereinafter referred to as "L") and a clock input CK is altered from "L" to "H", an output Q is changed from "H" to "L" if data is sufficiently early varied with respect to a clock input as shown in FIG. 5. On the other hand, if the data input D is altered in delay with respect to the change of the clock input CK as shown in FIG. 6, the output Q remains "H", and the level of the output Q is not varied. If the changes of the data input D and the clock input CK is very close as shown in FIG. 9, the potential of a point A shown in FIG. 4A is gradually altered from "H" to "L" to reach the circuit threshold value $V_{thCS}$ of the clocked inverter 5 of the slave stage circuit 2. Then, the output Q of the slave stage circuit 2 is inverted, and varied from "H" to "L". However, since the potential of the point A does not reach the circuit threshold value $V_{thCH}$ of the holding circuit, the potential of a point B remains "L" and does not change. Therefore, when the clock input is altered from "L" to "H", the level of the point A is raised to an "H" level by the clocked inverter 8.

When the potential of the point A is gradually raised to reach the $V_{thCS}$, the output Q of the slave stage circuit 2 is again inverted to change from "L" to "H". (ii) Assume that the circuit threshold value of the clocked inverter 4 is lower than that of the inverter 6. When the data input D of the flip-flop circuit is changed from a level "L" to a level "H" and the clock input CK is altered from "L" to "H", the output D is changed from "L" to "H" if the data input D is varied sufficiently early with respect to the change of the clock input CK as shown in FIG. 7. On the other hand, the output remains "L" and the level of the output is not varied if the data input D is changed in delay with respect to the change of the clock input CK as shown in FIG. 8. If the change of the data input D and the clock input CK are very close as shown in FIG. 10, the potential of the point A shown in FIG. 4A is gradually changed from "L" to "H" to reach the threshold value $V_{thCS}$ of the slave stage circuit 2. Then, the output Q of the slave stage circuit 2 is inverted to alter from "L" to "H". However, since the potential of the point A does not reach the circuit threshold value $V_{thCH}$ of the holding circuit 3, the potential of the point B remains "H" and does not change. Therefore, when the clock input is altered from "L" to "H", the level of the point A is lowered to a "L" level by the clocked inverter 8.

When the potential of the point A is gradually lowered to reach the $V_{thCS}$, the output Q of the slave stage circuit is again inverted to alter from "H" to "L".

The hazard of the output signal occurs under the conditions as shown in the above paragraphs (i) and (ii).

Since the strict matching of the circuit threshold value of the holding circuit 3 to that of the input circuit of the slave stage circuit 2 is impossible in a actual manufacturing environment, the above-mentioned hazard occurs if two or more control signals for specifying the operation of the flip-flop circuit in FIG. 4A are simultaneously changed.

Even when the transistor cell sizes of the holding circuit 3 and the slave stage circuit 2 are equally designed in the circuit, as shown, for example, in FIG. 2, there is not always a guarantee of matching the circuit threshold values of both the circuits due to irregularities in process parameters. In the circuit arrangement shown in FIG. 3, it is impossible to always match the circuit threshold value of the clocked inverter 5 of the slave stage circuit 2 when the clock input is changed to that of the inverter 6 of the holding circuit 3.

SUMMARY OF THE INVENTION

Accordingly, it is an object of the present invention to provide a flip-flop circuit which can prevent a phenomenon that an output is once inverted and again inverted to become stable in the metastable state, irrespective of the irregularities in circuit element constants in the flip-flop circuit or a sequential circuit having a flip-flop circuit.

According to the present invention, there is provided a master-slave type flip-flop circuit comprising a master output holding circuit of a master stage circuit, in which the threshold value of the input circuit of a slave stage circuit has such a hysteresis characteristic that the high level threshold value is set to a higher value than the threshold value of the master output holding circuit and the low level threshold value is set to a lower value than the threshold value of the master output holding circuit.

More specifically, in the prior art flip-flop circuits, if there is an unbalance between the threshold value of the input circuit of the slave circuit for receiving the output of the master circuit and the circuit threshold value of the master output holding circuit, the output signal of the slave circuit falls in a metastable state to become unstable.

In a master-slave type flip-flop circuit of the present invention, the input circuit of the slave stage circuit has a hysteresis characteristic in which its high level threshold value is set to a value higher than the threshold value of the master output holding circuit and its low level threshold value is set to a value lower than the threshold value of the master output holding circuit, thereby preventing a phenomenon that the output is once inverted and then again inverted in the metastable state.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIGS. 2, 3, 4A and 4B are circuit diagrams of a conventional master-slave flip-flop circuit;

FIGS. 5 to 10 are signal waveform diagrams showing the operation of the flip-flop circuit in FIG. 4A;

FIG. 16 shows a hysteresis characteristic curve of the input circuit 17 of the slave stage circuit 16.

DETAILED DESCRIPTION OF THE PREFERRED EMBODIMENTS

Figure 11:
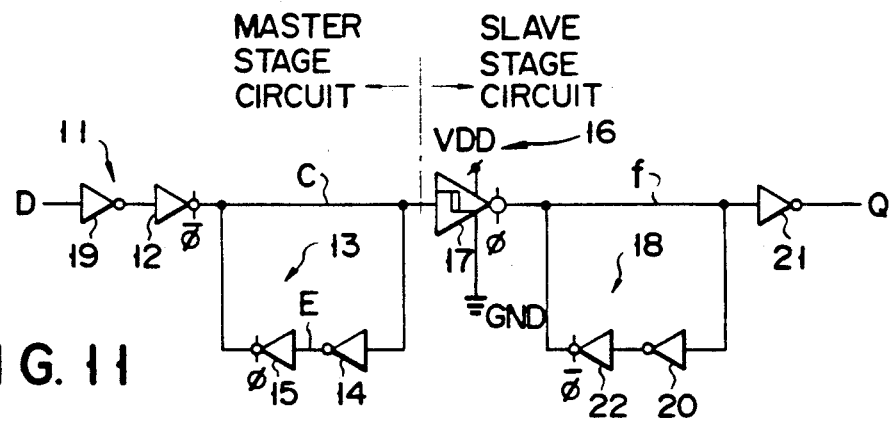
FIG. 11 is a circuit diagram of an embodiment of a flip-flop circuit according to the present invention.

An embodiment of a flip-flop circuit of the present invention will be described with reference to the accompanying drawings. FIG. 11 is a circuit diagram of the embodiment. The flip-flop circuit comprises a clocked inverter 12 of a master stage circuit 11, an inverter 14 and a clocked inverter 15 of a master output holding circuit 13, a clocked inverter 17 of a slave stage circuit 16, and an inverter 20 and a clocked inverter 22 of a slave output holding circuit 18. The clocked inverter 17 constitutes an input circuit of the slave output holding circuit 18. The inverter 14 has a threshold value, and the threshold value of the inverter 14 constitutes the threshold value of the master output holding circuit 13. The clocked inverter 17 has a hysteresis characteristic of its input threshold value as shown in FIG. 16, in which the high level threshold value $V_{IH}$ of the clocked inverter 17 is set to a value higher than the threshold value of the inverter 14, and the low level threshold value $V_{IL}$ is set to a value lower than the threshold value of the inverter 14. In FIG. 16, the point "0" denotes the GND potential. The flip-flop circuit of FIG. 11 further comprises an input inverter 19 and an output inverter 21.

Figure 12:
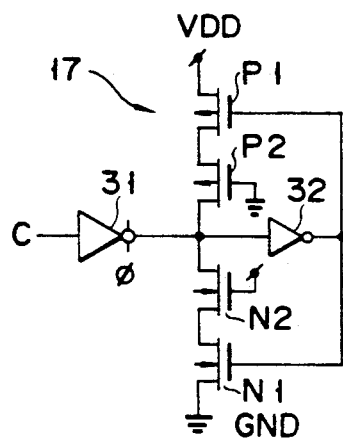
FIGS. 12 and 13 are detailed circuit diagrams of the input circuit 17 of the slave stage circuit 16 of the flip-flop circuit of FIG. 11.
Figure 13:
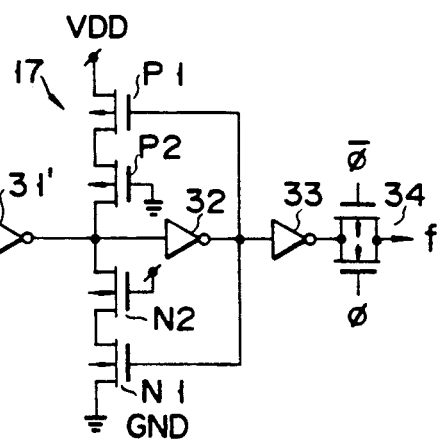

FIGS. 12 and 13 show examples of the clocked inverter 17 having the hysteresis characteristic composed of Schmitt circuits of complementary MOSFETs (metal oxide semiconductor field effect transfers). In the circuit of FIG. 12, P-channel transistors P1, P2 and N-channel transistors N1, N2 are connected in series between a power source $V_{DD}$ and a ground potential GND. The drains of the transistors P2 and N2 are connected to the output of a clocked inverter 31. The source of the transistor P1 is connected to the power source $V_{DD}$, and the source of the transistor N1 is connected to the ground potential. The gates of the transistors P1 and N1 are connected to the output of an inverter 32 which receives and inverts the output of the clocked inverter 31. The output of the inverter 32 is connected to an inverter 33, and the output of the inverter 33 constitutes the circuit output of the clocked inverter 17 in FIG. 12.

The clocked inverter 17 of FIG. 13 is different from that in FIG. 12 in that the clocked inverter 31 is replaced with an inverter 31', a transfer gate 34 is provided at the output of the inverter 33, and a circuit output is obtained through the gate 34.

The slave stage circuit 17 may be some other circuit if the circuit has a hysteresis characteristic as shown in FIG. 16.

Figure 14:
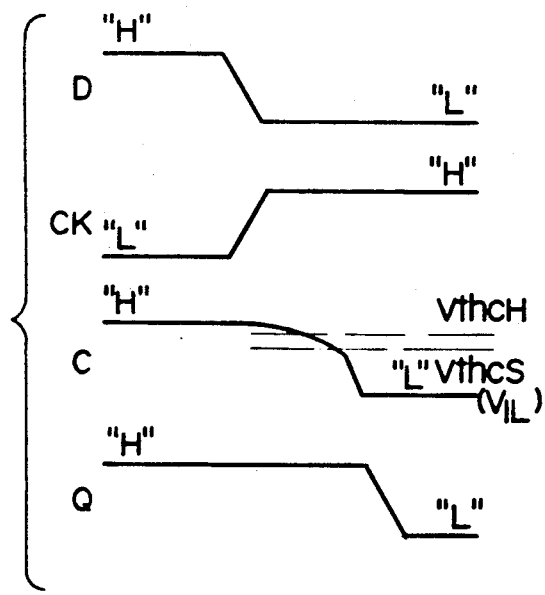
FIGS. 14 and 15 are signal waveform diagrams showing the operation of the flip-flop circuit of FIG. 11.

The operation of suppressing the output hazard of the flip-flop circuit of FIG. 11 will be described. In the flip-flop circuit of FIG. 11, the high level threshold value $V_{IH}$ of the clocked inverter 17 is set to a value higher than the threshold value of the inverter 14, and the low level threshold value $V_{IL}$ of the clocked inverter 17 is set to a value lower than the threshold value of the inverter 14. If the data input D is altered sufficiently early with respect to the change of the clock input CK as shown in FIG. 5 when the data input D of the flip-flop circuit is varied from "L" to "H" and the clock input CK is altered from "L" to "H", the output Q is altered from "H" to "L". On the other hand, if the data input D is varied in delay with respect to the change of the clock input CK as shown in FIG. 6, the output Q remains "H" and the level of the output Q is not altered. If the changes of the signals D, CK are very close as shown in FIG. 14, the potential of the point C shown in FIG. 11 is gradually changed from "H" to "L" to reach the circuit threshold value $V_{thCH}$ of the inverter 1 of the holding circuit 13. Then, the potential of a point E is altered from "L" to "H". Therefore, when the clock input CK is varied from "L" to "H", the potential of the point C is further lowered by the clocked inverter 15. In this way, a phenomenon that the potential at the point C is again raised does not occur. The output Q is inverted when the potential of the point C is lowered below the circuit threshold value $V_{thCS}$, i.e, below the low level threshold valve $V_{IL}$ of the slave stage circuit.

Figure 7:
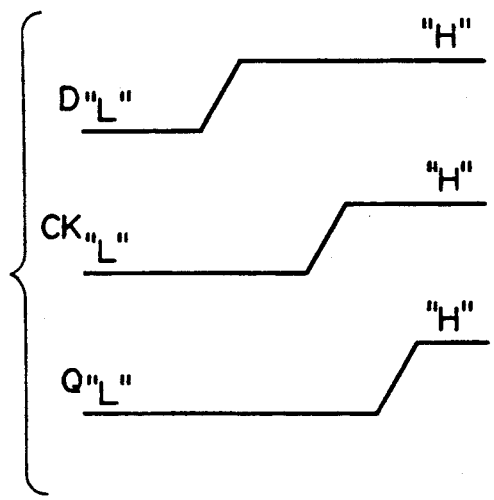
Figure 8:
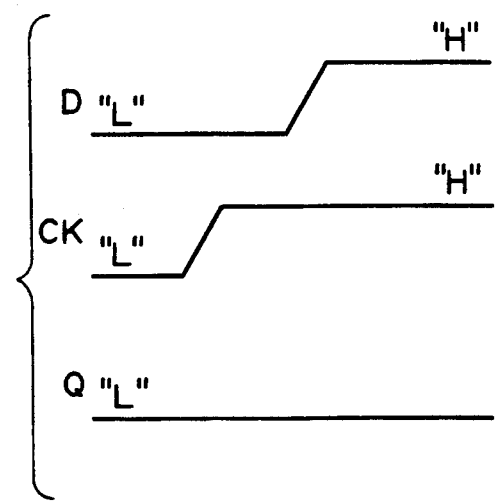
Figure 9:
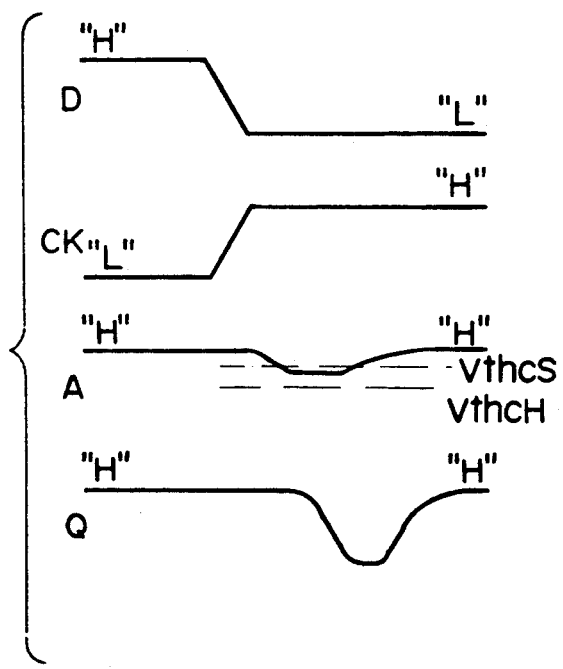
Figure 10:
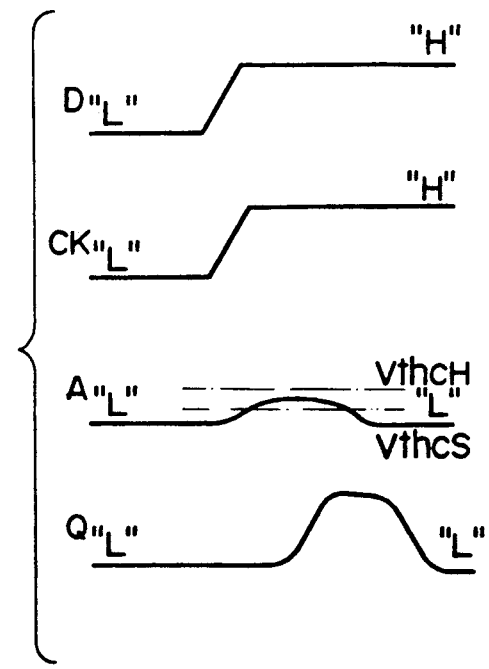
Figure 15:
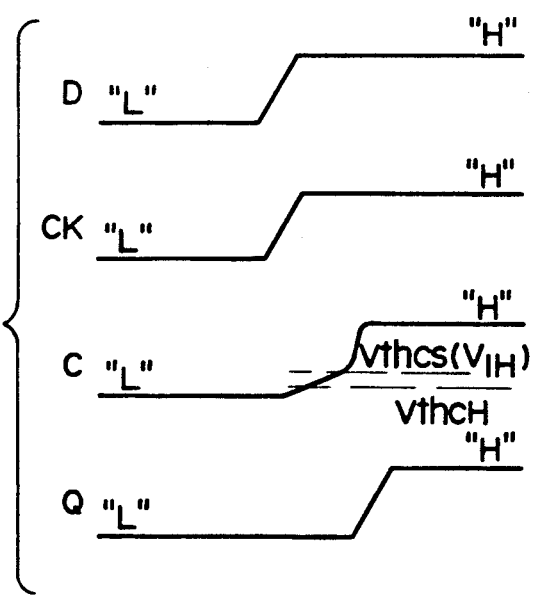

When the data input D of the flip-flop circuit is changed from a level "L" to a level "H" and the clock input CK is altered from "L" to "H", the output D is changed from "L" to "H" if the data input D is varied sufficiently early with respect to the change of the clock input CK as shown in FIG. 7. On the other hand, the output remains "L" and the level of the output is not varied if the data input D is changed in delay with respect to the change of the clock input CK as shown in FIG. 8. If the change of the data input D and the clock input CK are very close as shown in FIG. 15, the potential of the point C of FIG. 11 is gradually varied from "L" to "H" to reach the circuit threshold value $V_{thCH}$ of the inverter 14 of the master output holding circuit 13. Then, the potential of the point E is changed from "H" to "L". Therefore, when the clock input CK is varied from "L" to "H", the potential of the point C is further raised by the clocked inverter 15. Thus, a phenomenon that the potential of the point C is again lowered does not occur. The output Q is inverted when the potential of the point C is raised above the circuit threshold value $V_{thCS}$, i.e, above the high level threshold valve $V_{IH}$ of the slave stage circuit.

Figure 1:
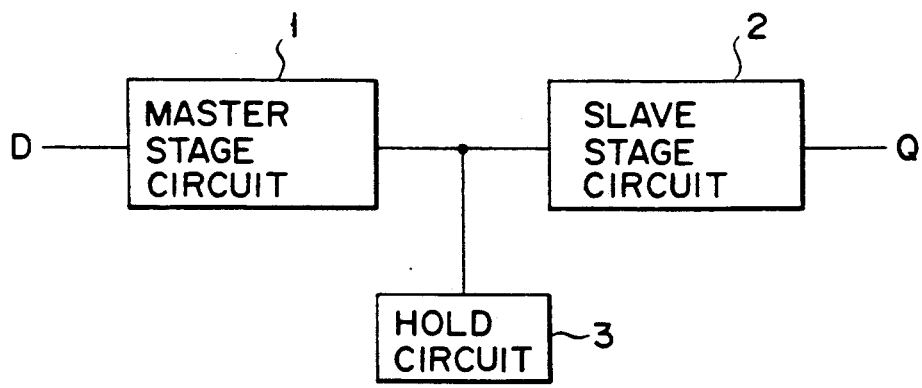
FIG. 1 is a basic block diagram of a master-slave sequential logic circuit.
Figure 2:
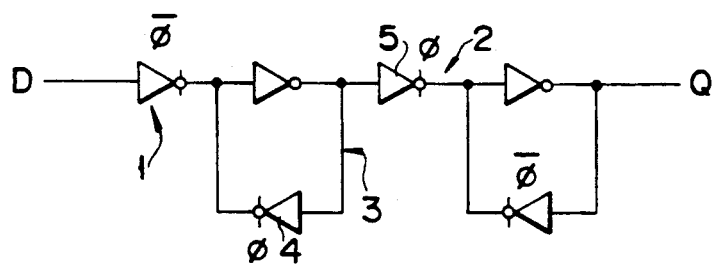
Figure 3:
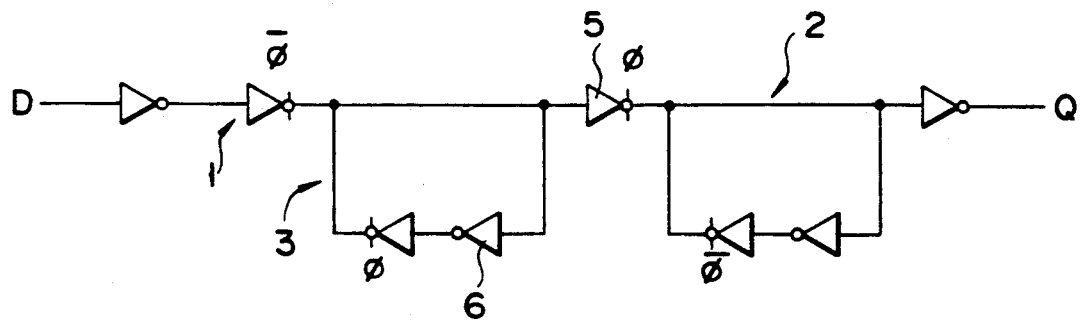

The present invention is not limited to the particular embodiment described above. Various modifications may be performed. For example, in the embodiment, the case of the positive logic circuit has been described. However, the present invention may also be applied to the case of the negative logic circuit. In this case, in the circuits shown in FIGS. 2 and 3, the power source $V_{DD}$ may be grounded, and the ground may be set to $-V_{DD}$.

As described above, in a master-slave type flip-flop circuit according to the present invention, the input circuit of slave stage circuit has a hysteresis characteristic in which the high level threshold value is set to a value higher than the threshold value of the master output holding circuit, and the low level threshold value is set to a value lower than the threshold value of the master output holding circuit. Therefore, the phenomenon that in the metastable state the circuit output is once inverted and again inverted can be prevented.

Additional advantages and modifications will readily occur to those skilled in the art. Therefore, the invention in its broader aspects is not limited to the specific details and representative devices shown and described herein. Accordingly, various modifications may be made without departing from the spirit or scope of the general inventive concept as defined by the appended claims and their equivalents.

What is claimed is:

1. A master-slave clocked CMOS flip-flop with hysteresis comprising:
    a clocked master stage circuit not having a hysteresis threshold characteristic;
    a clocked master output holding circuit having an input gate, for holding the output of said master stage circuit, the clocked master output holding circuit having a threshold voltage;
    a clocked slave stage circuit having an input circuit for receiving the output of said master stage circuit, the input circuit having an input gate; and
    a clocked slave output holding circuit for holding the output of said slave stage circuit;
    in which said input gate of said input circuit of said clocked slave stage circuit is connected to said input gate of said clocked master output holding circuit; and said input circuit of said slave stage circuit has a hysteresis threshold characteristic, in which a high level threshold voltage is higher than said threshold voltage of said master output holding circuit and a low level threshold voltage is lower than said threshold voltage of said master output holding circuit.

2. A master-slave clocked CMOS flip-flop with hysteresis, according to claim 1, in which said input circuit of said slave stage circuit comprises a clocked circuit controlled by a clock signal.

3. A master-slave clocked CMOS flip-flop with hysteresis according to claim 2, in which said clocked circuit comprises a clocked inverter controlled by said clock signal.

4. A master-slave clocked CMOS flip-flop with hysteresis according to claim 3, in which said clocked inverter comprises a Schmitt circuit controlled by said clock signal.

5. A master-slave clocked CMOS flip-flop with hysteresis according to claim 4, in which said Schmitt circuit comprises complementary MOS transistors controlled by said clock signal.

6. A master-slave clocked CMOS flip-flop with hysteresis according to claim 5, in which said Schmitt circuit comprises a clocked inverter controlled by said clock signal for receiving an input signal, a first inverter for receiving an output signal of said clocked inverter, a second inverter for receiving an output signal of said first inverter, first and second MOS transistors of a first channel type connected in series between a first power source and an input terminal of said first inverter, and third and fourth MOS transistors of a second channel type connected in series between a second power source and said input terminal of said first inverter, one output terminal of said first MOS transistor being connected to said first power source, the other output terminal of said first MOS transistor being connected to one output terminal of said second MOS transistor, the other output terminal of said second MOS transistor being connected to said input terminal of said first inverter, a control terminal of said first MOS transistor being connected to an output terminal of said first inverter, a control terminal of said second MOS transistor being connected to said second power source, one output terminal of said third MOS transistor being connected to said second power source, the other output terminal of said third MOS transistor being connected to one output terminal of said fourth MOS transistor, the other output terminal of said fourth MOS transistor being connected to said input terminal of said first inverter, a control terminal of said third MOS transistor being connected to an output terminal of said first inverter, a control terminal of said fourth MOS transistor being connected to said first power source.

7. A master-slave clocked CMOS flip-flop with hysteresis according to claim 6, in which said first channel type of said first and second MOS transistors is a P-channel type, said first power source is a high potential power source, said second channel type of said third and fourth MOS transistors is an N-channel type, and said second power source is a low potential power source.

8. A master-slave clocked CMOS flip-flop with hysteresis according to claim 7, in which said low potential power source is ground.

9. A master-slave clocked CMOS flip-flop with hysteresis according to claim 5, in which said Schmitt circuit comprises a first inverter for receiving an input signal, a second inverter for receiving an output signal of said first inverter, a third inverter for receiving an output signal of said third inverter, a transfer gate circuit controlled by a control signal, for passing therethrough an output signal of said third inverter, first and second MOS transistors of a first channel type connected in series between a first power source and an input terminal of said second inverter, and third and fourth MOS transistors of a second channel type connected in series between a second power source and said input terminal of said second inverter, one output terminal of said first MOS transistor being connected to said first power source, the other output terminal of said first MOS transistor being connected to one output terminal of said second MOS transistor, the other output terminal of said second MOS transistor being connected to said input terminal of said second inverter, a control terminal of said first MOS transistor being connected to an output terminal of said second inverter, a control terminal of said second MOS transistor being connected to said second power source, one output terminal of said third MOS transistor being connected to said second power source, the other output terminal of said third MOS transistor being connected to one output terminal of said fourth MOS transistor, the other output terminal of said fourth MOS transistor being connected to said input terminal of said second inverter, a control terminal of said third MOS transistor being connected to an output terminal of said second inverter, a control terminal of said fourth MOS transistor being connected to said first power source.

10. A master-slave clocked CMOS flip-flop with hysteresis according to claim 9, in which said first channel type of said first and second MOS transistors is a P-channel type, said first power source is a high potential power source, said second channel type of said third and fourth MOS transistors is an N-channel type, and said second power source is a low potential power source.

11. A master-slave clocked CMOS flip-flop with hysteresis according to claim 10, in which said low potential power source is ground.

12. A master-slave clocked CMOS flip-flop with hysteresis according to claim 9, in which said transfer gate circuit comprises a first MOS transistor of a first channel type and a second MOS transistor of a second channel type connected in parallel, controlled by said clock signal.

13. A master-slave clocked CMOS flip-flop with hysteresis according to claim 12, in which said first channel type of said first MOS transistor is a P-channel type, and said second channel type of said second transistor is an N-channel type.

* * * * *